(12) United States Patent
Grigg

(10) Patent No.: US 7,041,532 B2
(45) Date of Patent: *May 9, 2006

(54) METHODS FOR FABRICATING INTERPOSERS INCLUDING UPWARDLY PROTRUDING DAMS

(75) Inventor: Ford B. Grigg, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/787,872

(22) Filed: Feb. 25, 2004

(65) Prior Publication Data

US 2004/0166607 A1 Aug. 26, 2004

Related U.S. Application Data

(62) Division of application No. 10/301,385, filed on Nov. 21, 2002, which is a continuation of application No. 09/560,970, filed on Apr. 28, 2000, now Pat. No. 6,531,335.

(51) Int. Cl.
*H01L 21/44* (2006.01)
*H01L 21/48* (2006.01)
*H01L 21/50* (2006.01)

(52) U.S. Cl. ............... 438/106; 438/108; 438/115
(58) Field of Classification Search ............... 438/106, 438/108, 115
See application file for complete search history.

(56) References Cited

U.S. PATENT DOCUMENTS

| 4,143,456 A | * | 3/1979 | Inoue | 29/841 |
|---|---|---|---|---|
| 4,218,701 A | * | 8/1980 | Shirasaki | 257/778 |
| 4,843,036 A | * | 6/1989 | Schmidt et al. | 438/64 |
| 4,883,730 A | | 11/1989 | Ahne et al. | |
| 5,173,220 A | * | 12/1992 | Reiff et al. | 264/401 |

(Continued)

FOREIGN PATENT DOCUMENTS

| EP | 0692823 A1 | 11/1994 |
|---|---|---|
| JP | 199716954 | 1/1997 |
| JP | 10098130 A | 4/1998 |

OTHER PUBLICATIONS

Harper, Charles A., "Electronic Packaging and Interconnection HandBook," 1991, pp. 1.5–1.7, R.R. Donnelley & Sons Company.
Edwards et al., "Thermal Performance of Tape Based Ball Grid Array Over Moded Packages," 14th IEEE Semi–Therm Symposium, 0–7803–4486, Mar. 1998, pp. 169–175.
Salmon., "UV Cure Epoxie for Electronic Encapsulation," Proceedings of NEPCON West 98, vol. 2, pp. 797–812, 1998.
Miller et al., "Maskless Mesoscale Materials Deposition," Deposition Technology, Sep. 2001, pp. 20–22.

(Continued)

*Primary Examiner*—Ha Tran Nguyen
*Assistant Examiner*—Angel Roman
(74) *Attorney, Agent, or Firm*—TraskBritt

(57) ABSTRACT

A method for fabricating an interposer includes providing an interposer substrate with at least one slot or aperture therethrough and forming at least one upwardly protruding dam on the interposer substrate, adjacent to the slot or aperture. The upwardly protruding dam or dams may at least partially surround the slot or aperture. Accordingly, the upwardly protruding dam or dams may laterally confine encapsulant material over the slot or aperture and over any intermediate conductive elements extending through the slot or aperture. Programmed material consolidation processes, such as stereolithography, may be used to form the at least one upwardly protruding dam.

22 Claims, 8 Drawing Sheets

U.S. PATENT DOCUMENTS

| | | | |
|---|---|---|---|
| 5,259,793 A | 11/1993 | Yamada et al. | |
| 5,264,061 A | 11/1993 | Juskey et al. | |
| 5,278,442 A | 1/1994 | Prinz et al. | |
| 5,336,931 A | 8/1994 | Juskey et al. | |
| 5,484,314 A * | 1/1996 | Farnworth | 445/24 |
| 5,574,310 A | 11/1996 | Sono et al. | |
| 5,577,319 A | 11/1996 | Knecht | |
| 5,650,593 A | 7/1997 | McMillan et al. | |
| 5,705,117 A | 1/1998 | O'Connor et al. | |
| 5,714,800 A | 2/1998 | Thompson | |
| 5,714,802 A | 2/1998 | Cloud et al. | |
| 5,719,440 A | 2/1998 | Moden | |
| 5,734,201 A | 3/1998 | Djennas et al. | |
| 5,767,443 A | 6/1998 | Farnworth et al. | |
| 5,793,116 A | 8/1998 | Rinne et al. | |
| 5,834,830 A | 11/1998 | Cho | |
| 5,866,949 A | 2/1999 | Schueller | |
| 5,920,118 A | 7/1999 | Kong | |
| 5,965,933 A | 10/1999 | Young et al. | |
| 5,977,640 A | 11/1999 | Bertin et al. | |
| 5,994,166 A | 11/1999 | Akram et al. | |
| 5,999,413 A | 12/1999 | Ohuchi et al. | |
| 6,013,946 A * | 1/2000 | Lee et al. | 257/684 |
| 6,091,140 A * | 7/2000 | Toh et al. | 257/691 |
| 6,124,407 A | 9/2000 | Lee et al. | |
| 6,144,102 A | 11/2000 | Amagai | |
| 6,222,263 B1 | 4/2001 | Sherif et al. | |
| 6,239,013 B1 | 5/2001 | Hotchkiss | |
| 6,249,052 B1 | 6/2001 | Lin | |
| 6,251,488 B1 | 6/2001 | Miller et al. | |
| 6,252,298 B1 | 6/2001 | Lee et al. | |
| 6,259,962 B1 | 7/2001 | Gothait | |
| 6,268,584 B1 | 7/2001 | Keicher et al. | |
| 6,300,165 B1 | 10/2001 | Castro | |
| 6,322,903 B1 | 11/2001 | Siniaguine et al. | |
| 6,333,564 B1 | 12/2001 | Katoh et al. | |
| 6,372,552 B1 | 4/2002 | Kinsman et al. | |
| 6,380,557 B1 * | 4/2002 | Takahara | 257/48 |
| 6,391,251 B1 | 5/2002 | Keicher et al. | |
| 6,448,664 B1 | 9/2002 | Tay et al. | |
| 6,468,891 B1 | 10/2002 | Williams | |
| 6,479,887 B1 | 11/2002 | Yoon et al. | |
| 6,489,183 B1 | 12/2002 | Farnworth | |
| 6,500,746 B1 | 12/2002 | Williams | |
| 6,522,019 B1 | 2/2003 | Tay et al. | |
| 6,524,346 B1 | 2/2003 | Farnworth | |
| 6,529,027 B1 | 3/2003 | Akram et al. | |
| 6,531,335 B1 * | 3/2003 | Grigg | 438/106 |
| 6,537,842 B1 | 3/2003 | Akram | |
| 6,544,902 B1 | 4/2003 | Farnworth | |
| 6,611,053 B1 | 8/2003 | Akram | |
| 6,630,730 B1 | 10/2003 | Grigg | |
| 6,632,732 B1 | 10/2003 | Williams | |
| 6,634,100 B1 | 10/2003 | Akram et al. | |
| 6,731,010 B1 | 5/2004 | Horiuchi et al. | |
| 6,818,474 B1 | 11/2004 | Kim et al. | |
| 2002/0102829 A1 | 8/2002 | Williams | |
| 2002/0111003 A1 | 8/2002 | Williams | |
| 2002/0171177 A1 | 11/2002 | Kritchman et al. | |
| 2003/0045047 A1 | 3/2003 | Williams | |
| 2003/0098470 A1 | 5/2003 | Williams | |
| 2003/0102566 A1 | 6/2003 | Farnworth | |
| 2003/0141885 A1 | 7/2003 | Akram et al. | |
| 2003/0151167 A1 | 8/2003 | Kritchman et al. | |
| 2003/0180974 A1 | 9/2003 | Akram | |
| 2003/0181003 A1 | 9/2003 | Akram | |
| 2003/0186496 A1 | 10/2003 | Akram | |
| 2004/0014255 A1 | 1/2004 | Grigg et al. | |
| 2004/0018709 A1 | 1/2004 | Williams | |

OTHER PUBLICATIONS

Miller et al., "New Laser–Directed Deposition Technology," Microelectronic Fabrication, Aug. 2001, p. 16.

Webpage, Objet Prototyping the Future, "Objet FullCure700 Series," 1 page.

Webpage, Objet Prototyping the Future, "How it Works," 2 pages.

U.S. Appl. No. 09/511,986, filed Feb. 24, 2000, entitled "Stereolithographically Fabricated Conductive Elements, Semiconductor Device Components and Assemblies Including Such Conductive Elements, and Methods," inventor Vernon M. Williams.

U.S. Appl. No. 10/641,471, filed Aug. 14, 2003, entitled "Protective Structures for Bond Wires," inventor Salman Akram.

U.S. Appl. No. 10/648,163, filed Aug. 26, 2003, entitled "Method for Fabricating an Interposer," inventor Akram et al.

U.S. Appl. No. 10/688,354, filed Oct. 17, 2003, entitled "Thick Solder Mask for Confining Encapsulant Material Over Selected Locations of a Substrate and Assemblies Including the Solder Mask," inventor Grigg et al.

* cited by examiner

METHODS FOR FABRICATING INTERPOSERS INCLUDING UPWARDLY PROTRUDING DAMS

CROSS-REFERENCE TO RELATED APPLICATIONS

This application is a divisional of application Ser. No. 10/301,385, filed Nov. 21, 2002, which is a continuation of application Ser. No. 09/560,970, filed Apr. 28, 2000, now U.S. Pat. No. 6,531,335, issued Mar. 11, 2003.

BACKGROUND OF THE INVENTION

1. Field of the Invention

The present invention relates generally to interposers for use in chip-scale packages (CSPs), including ball grid array (BGA) packages. Particularly, the present invention relates to interposers that include upwardly protruding dams configured to laterally confine encapsulant material over a specified area of the interposer. The invention also relates to semiconductor device packages including the interposers and to methods of fabricating the upwardly protruding dams, the interposers, and assemblies including the interposers.

Semiconductor Device Packages

2. Background of Related Art

Semiconductor devices, such as memory devices and processors, are generally fabricated in very large numbers. Typically, several semiconductor devices are fabricated on a wafer or other large scale substrate that includes a layer of semiconductor material (e.g., silicon, gallium arsenide, or indium phosphide). The semiconductor devices are then singulated, or diced, from the wafer or other large scale substrate to provide semiconductor "chips" or dice.

Conventionally, semiconductor dice have been packaged for protection and to facilitate the formation of electrical connections to the small bond pads thereof. Conventional semiconductor device packages typically include an assembly of a semiconductor die and a higher level substrate board (e.g., a circuit board) or leads. Bond pads of the semiconductor die are electrically connected (e.g., by wire bonds or otherwise) to contact pads of a higher level substrate or to leads. The assembly may then be packaged. For example, assemblies that include a semiconductor die with leads connected to the bond pads thereof are typically packaged by use of transfer molding techniques to secure the leads in place and to protect the active surface of the semiconductor die and the wire bonds or other intermediate conductive elements. Assemblies including a semiconductor die and a higher level substrate may be packaged by injection molding techniques or with a glob-top type encapsulant, both of which protect the active surface of the semiconductor die and the wire bonds or other intermediate conductive elements.

Due to the ever-decreasing sizes of state of the art electronic devices, conventional semiconductor device packages are relatively bulky. As a result, alternative semiconductor device packaging configurations have been developed to reduce the amount of area, or "real estate," on circuit boards consumed by semiconductor device packages.

Among these state of the art semiconductor device packages are the so-called chip-scale packages, the areas of which are substantially the same as or only slightly larger than the areas of the semiconductor dice thereof. Chip-scale packages may include a semiconductor die and an interposer superimposed over the semiconductor die. The bond pads of the semiconductor die are electrically connected to contact pads of the interposer, which are in turn electrically connected to a circuit board or other carrier substrate through traces extending to other contact elements that mate with terminals on the circuit board or other carrier substrate.

An exemplary ball grid array type chip-scale package 201 is illustrated in FIG. 1. Package 201 includes a semiconductor die 202 and an interposer 206 positioned over an active surface 203 of semiconductor die 202. Interposer 206 is secured to semiconductor die 202 with a layer 215 of adhesive material. A quantity of underfill material 216 is introduced between semiconductor die 202 and interposer 206 to fill any remaining open areas therebetween.

Interposer 206 includes a slot 207 formed therethrough. Bond pads 204 on an active surface 203 of semiconductor die 202 are exposed through slot 207. Bond pads 204 are connected by way of wire bonds 205 or other intermediate conductive elements to corresponding first contact pads 208 on interposer 206. As illustrated, wire bonds 205 extend through slot 207. Each first contact pad 208 communicates with a corresponding second contact pad 209 on interposer 206 by way of a conductive trace 210 carried by interposer 206. Second contact pads 209 may be arranged so as to reroute the output locations of bond pads 204. Thus, the locations of second contact pads 209 may also impart interposer 206 with a desired footprint, and particularly one which corresponds to the arrangement of terminal pads on a carrier substrate (not shown) to which package 201 is to be connected. Bond pads 204, wire bonds 205, and first contact pads 208 are each protected by a quantity of an encapsulant material 211, such as a glob-top type encapsulant.

Package 201 is electrically connected to a carrier substrate by way of conductive structures 213, such as solder balls, connected to second contact pads 209 and corresponding contact pads of the carrier substrate. Package 201 is configured to be connected to a carrier substrate in an inverted, or flip-chip, fashion, which conserves real estate on the carrier substrate. It is also known in the art to connect a chip-scale package to a carrier substrate by way of wire bonds or other conductive elements. Such assemblies, packages and interposers are disclosed, for example, in U.S. Pat. No. 5,719,440, issued to Walter L. Moden and assigned to the assignee of the invention disclosed and claimed herein.

The introduction of underfill materials between a semiconductor die and an interposer secured thereto is somewhat undesirable since an additional assembly step is required. Moreover, as conventional underfill materials flow into the spaces between a semiconductor die and an interposer, voids or bubbles may form and remain therein.

In addition, the use of glob-top type encapsulants to protect the bond pads and intermediate conductive elements of such chip-scale packages is somewhat undesirable since glob-top encapsulants may flow laterally over the second contact pads or conductive structures protruding therefrom. While more viscous encapsulant materials may be used, because viscous glob-top encapsulants typically cure with a convex surface, the amount of encapsulant needed to adequately protect the bond wires or other intermediate conductive elements between the bond pads and first contact pads may result in a glob-top that protrudes an undesirable distance from the interposer, which may require the removal of some of the convex portion of the glob-top or the use of undesirably long conductive elements between the second contact pads of the interposer and the contact pads of the carrier substrate.

U.S. Pat. No. 5,714,800, issued to Patrick F. Thompson, discloses an interposer with a stepped outer periphery. The first contact pads are located on the lower, peripheral portion of the interposer, while the second contact pads are positioned on the higher, central region of the interposer. The vertical wall between the lower and higher regions of the interposer prevents liquid encapsulant material from flowing laterally beyond the lower portion of the interposer and thus prevents the liquid encapsulant material from flowing onto the second contact pads. As the lower, peripheral portion of the interposer must have a sufficient thickness and rigidity to support the first contact pads thereon and since the difference in height between the peripheral and central regions of the interposer should be sufficient to facilitate complete encapsulation of an intermediate conductive element, such as a bond wire, that is connected to and raised somewhat above a first contact pad, the stepped interposer is relatively thick and undesirably adds to the overall thickness of a semiconductor device package of which it is a part. Moreover, fabrication of the stepped interposer requires additional machining or alignment of layers to create a stepped periphery. In addition, when an interposer with a stepped periphery is used, since the intermediate conductive elements and bond pads are located near the periphery of the semiconductor die-interposer assembly, it would by very difficult to encapsulate bond pads and intermediate conductive elements with a glob-top type encapsulant.

Accordingly, there is a need for a structure on an interposer that prevents the lateral flow of glob-top type encapsulant materials. There is also a need for a structure that contains relatively low viscosity encapsulant materials over desired areas of an interposer.

Stereolithography

In the past decade, a manufacturing technique termed "stereolithography," also known as "layered manufacturing," has evolved to a degree where it is employed in many industries.

Essentially, stereolithography as conventionally practiced involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and non-metallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a partially consolidated, or semisolid, state in those areas of a given layer corresponding to portions of the object, the consolidated or fixed material also at that time being substantially concurrently bonded to a lower layer of the object to be fabricated. The unconsolidated material employed to build an object may be supplied in particulate or liquid form, and the material itself may be consolidated or fixed, or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer that can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed may be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

However, to the inventor's knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results are required. In particular, the inventor is not aware of the use of stereolithography to fabricate structures for preventing the lateral flow of encapsulant materials beyond desired areas of interposers or other substrates. Furthermore, conventional stereolithography apparatus and methods fail to address the difficulties of precisely locating and orienting a number of pre-existing components for stereolithographic application of material thereto without the use of mechanical alignment techniques or to otherwise assuring precise, repeatable placement of components.

SUMMARY OF THE INVENTION

The present invention includes a dam for use on an interposer. When secured to a surface of an interposer, the dam is configured to protrude above the surface so as to prevent an encapsulant material from flowing laterally beyond a desired area of the interposer. The present invention also includes interposers with one or more such upwardly protruding dams positioned thereon, as well as semiconductor device assemblies and packages including interposers with one or more upwardly protruding dams thereon.

Each upwardly protruding dam according to the present invention is configured to be secured to a surface of an interposer. The upwardly protruding dams may be configured to fully or partially surround an area of an interposer over which an encapsulant material is to be disposed. The upwardly protruding dams are configured to at least partially laterally confine a quantity of encapsulant material over at least a portion of the surface of the interposer. The upwardly protruding dams of the present invention may be fabricated by any known substrate or semiconductor device component fabrication process. Preferably, upwardly protruding dams incorporating teachings of the present invention are fabricated from a photocurable polymer, or "photopolymer," by way of known stereolithography processes, such as the hereinafter more fully described stereolithography process. Each upwardly protruding dam may include one layer or a plurality of superimposed, contiguous, mutually adhered layers of material. An upwardly protruding dam according to the present invention may be fabricated directly on an interposer or separately therefrom, then secured thereto by known techniques, such as the use of an adhesive material.

An interposer according to the present invention may include one or more slots or apertures formed completely therethrough. In one embodiment of the interposer, an elongate, substantially centrally located slot facilitates the formation of electrical connections from the bond pads of a semiconductor die with one or more substantially centrally located rows of bond pads to corresponding first contact pads located near the slot of the interposer. Electrical traces carried by the interposer connect each first contact pad to a corresponding second contact pad on an upper surface of the interposer opposite from the semiconductor die. The second contact pads are disposed in an array over the surface of the interposer. The upwardly protruding dam at least partially laterally surrounds the slot and at least the first contact pads of the interposer and, preferably, substantially completely laterally surrounds the slot and first contact pads.

The interposer may be assembled with a semiconductor die by placing one or more dielectric, adhesive strips between the active surface of the semiconductor die and a lower surface of the interposer. The dielectric, adhesive strips at least partially laterally surround the bond pads on the active surface of the semiconductor die, as well as impart stability to the assembly. The bond pads of the semiconductor die may be electrically connected to the corresponding first contact pads of the interposer by way of known intermediate conductive elements, such as wire bonds, that extend through the one or more slots or apertures of the interposer.

In a semiconductor device package incorporating teachings of the present invention, a quantity of encapsulant material may be disposed over the one or more slots or apertures so as to electrically insulate each of the intermediate conductive elements extending therethrough. The one or more dams protruding upwardly from the upper surface of the interposer at least partially laterally confine the encapsulant material, preventing the encapsulant material from flowing laterally beyond the one or more dams. If the upwardly protruding dam substantially laterally surrounds the one or more slots and second contact pads, a low viscosity encapsulant material may be employed, facilitating the formation of a "glob-top" with a less convex, or even no, meniscus. When the interposer includes such an upwardly protruding dam and a low viscosity encapsulant material is used, the encapsulated mass may actually have a substantially planar surface, reducing the overall thickness of the semiconductor device package.

A semiconductor device package incorporating teachings of the present invention may also include a sealing element between the interposer and the semiconductor die. The sealing element substantially laterally surrounds the bond pads of the semiconductor die and may be at least partially formed by the one or more adhesive strips securing the interposer to the active surface of the semiconductor die. The sealing element may also include a sealing material, such as a photopolymer, disposed between the interposer and semiconductor die. When a photopolymer is used to form at least a portion of the sealing element, the hereinafter more fully described stereolithography processes may be used to at least partially consolidate the photopolymer. A photopolymer portion of the sealing element may be located at or adjacent an outer periphery of one or both of the interposer and semiconductor die or adjacent a periphery of the slot formed through the interposer.

According to another aspect, the present invention includes a method for fabricating the dam, as well as a method for fabricating all or part of a sealing element from a photopolymer. In a preferred embodiment of the method, a computer-controlled, 3-D CAD initiated process known as "stereolithography" or "layered manufacturing" is used to fabricate the dam or sealing element. When stereolithographic processes are employed, each dam is formed as either a single layer or a series of superimposed, contiguous, mutually adhered layers of material.

The stereolithographic method of fabricating the dams or sealing elements of the present invention preferably includes the use of a machine vision system to locate the interposers or other substrates on which the dams are to be fabricated, as well as the features or other components on or associated with the interposers or other substrates (e.g., solder bumps, contact pads, conductive traces, etc.). The use of a machine vision system directs the alignment of a stereolithography system with each interposer or other substrate for material disposition purposes. Accordingly, the interposers or other substrates need not be precisely mechanically aligned with any component of the stereolithography system to practice the stereolithographic embodiment of the method of the present invention.

In a preferred embodiment, the dams to be fabricated upon or positioned upon and secured to interposers in accordance with the invention are fabricated using precisely focused electromagnetic radiation in the form of an ultraviolet (UV) wavelength laser under control of a computer and responsive to input from a machine vision system, such as a pattern recognition system, to fix or cure selected regions of a layer of a liquid photopolymer material disposed on the semiconductor device or other substrate.

Sealing elements may be stereolithographically fabricated on an assembly including a semiconductor die and an interposer positioned on the active surface thereof.

Other features and advantages of the present invention will become apparent to those of ordinary skill in the art through consideration of the ensuing description, the accompanying drawings, and the appended claims.

DETAILED DESCRIPTION OF THE INVENTION

Figure 2:
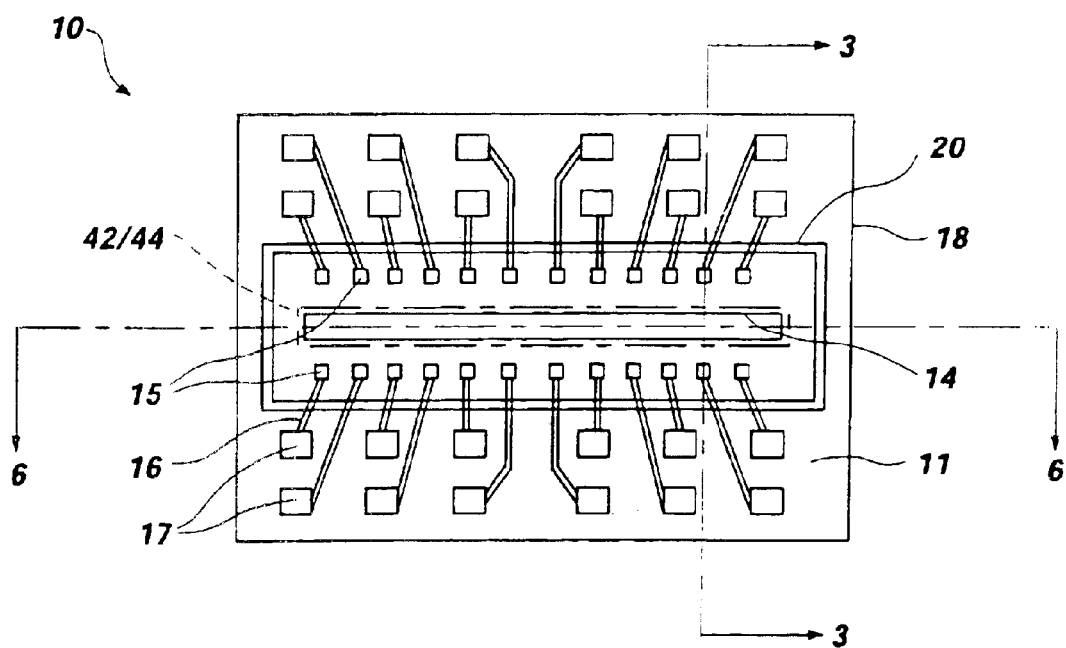
FIG. 2 is a top view of a first embodiment of an interposer including a slot formed therethrough and an upwardly protruding dam secured to a surface of the interposer adjacent to and surrounding the slot.

With reference to FIG. 2, an exemplary interposer 10 incorporating teachings of the present invention is shown. Interposer 10 is a substantially planar member formed from, for example, FR-4 resin, semiconductor material (e.g., silicon), or any other known substrate material and having an upper surface 11 and a lower surface 12 (see FIGS. 2–6). As illustrated in FIG. 2, interposer 10 includes an elongate slot 14 formed therethrough. Slot 14 is positioned substantially along the center of interposer 10. Interposer 10 also includes first contact pads 15, or contacts, located proximate slot 14. Electrical traces 16 carried by interposer 10 connect each first contact pad 15 to a corresponding second contact pad 17 carried on upper surface 11 of interposer 10. As depicted, second contact pads 17 are arranged in an array over upper surface 11.

A dam 20 secured to upper surface 11 of interposer 10 protrudes upwardly therefrom. Dam 20 at least partially laterally surrounds slot 14 and first contact pads 15. As shown in FIG. 2, dam 20 substantially completely laterally surrounds slot 14 and first contact pads 15. Second contact pads 17 are located laterally outside of dam 20.

Figure 3:
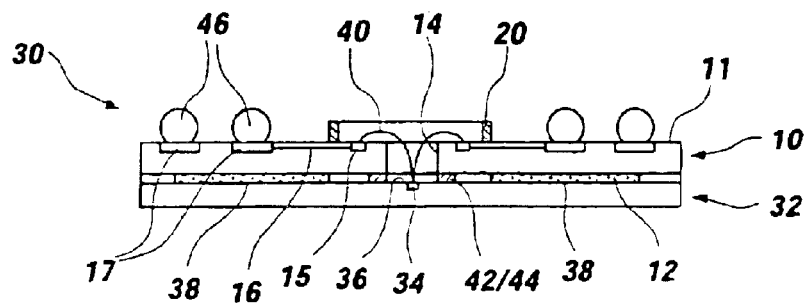
FIG. 3 is a cross-sectional view of an assembly including the interposer and dam of FIG. 2, taken along line 3—3 thereof, and a semiconductor die connected to the interposer.
Figure 4:
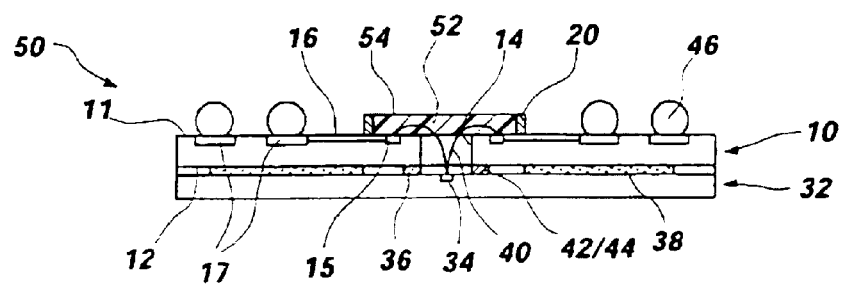
FIG. 4 is a cross-sectional view of a semiconductor device package including the assembly of FIG. 3, depicting an encapsulant material disposed over the slot and laterally confined by the upwardly protruding dam and a sealing element between the interposer and the die and laterally surrounding the bond pads of the die.
Figure 5:
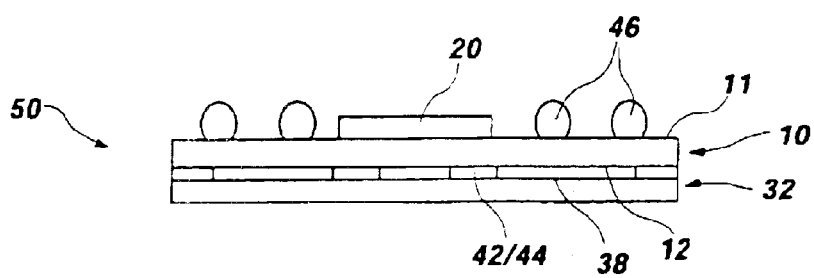
FIG. 5 is a side view of the semiconductor device package shown in FIG. 4.
Figure 6:
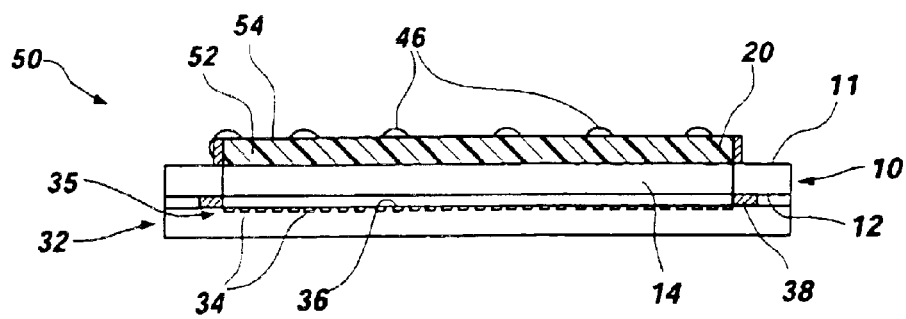
FIG. 6 is another cross-sectional view of the semiconductor device package shown in FIG. 4, which includes the interposer of FIG. 2, the cross-section being taken along line 6—6 of FIG. 2.

FIG. 3 depicts an assembly 30 including interposer 10 and a semiconductor die 32 with bond pads 34 positioned on an active surface 36 thereof in one or more centrally located rows 35 (see FIG. 6). As illustrated, two parallel strips of adhesive film 38 are placed between active surface 36 of semiconductor die 32 and lower surface 12 of interposer 10 so as to secure interposer 10 to semiconductor die 32. Intermediate conductive elements 40, which are illustrated as wire bonds but may also be any other known type of intermediate conductive elements, extend through slot 14 to electrically connect bond pads 34 of semiconductor die 32 to corresponding first contact pads 15 of interposer 10.

Assembly 30 may also include a sealing element 42 that laterally surrounds and seals bond pads 34 of semiconductor die 32. Sealing element 42 may comprise adhesive film 38 and, in lieu of two strips of adhesive film 38, adhesive film 38 may be cut to form a frame, the aperture of which lies over bond pads 34. Alternatively, or in addition, sealing element 42 may include a quantity of material 44 disposed between active surface 36 of semiconductor die 32 and lower surface 12 of interposer 10. Preferably, material 44 is a photopolymer. In FIG. 3, sealing element 42 is depicted with material 44 being located adjacent (e.g., beneath) at least the end edges of slot 14.

Figure 6A:
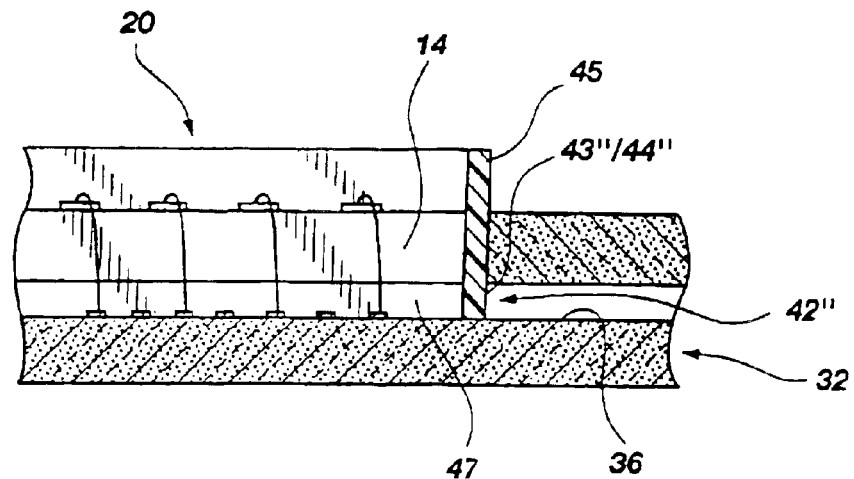
FIG. 6A is an enlarged, partial cross-sectional view of a package including the assembly shown in FIG. 3, depicting a variation of the sealing element shown in FIGS. 2–6.
Figure 6B:
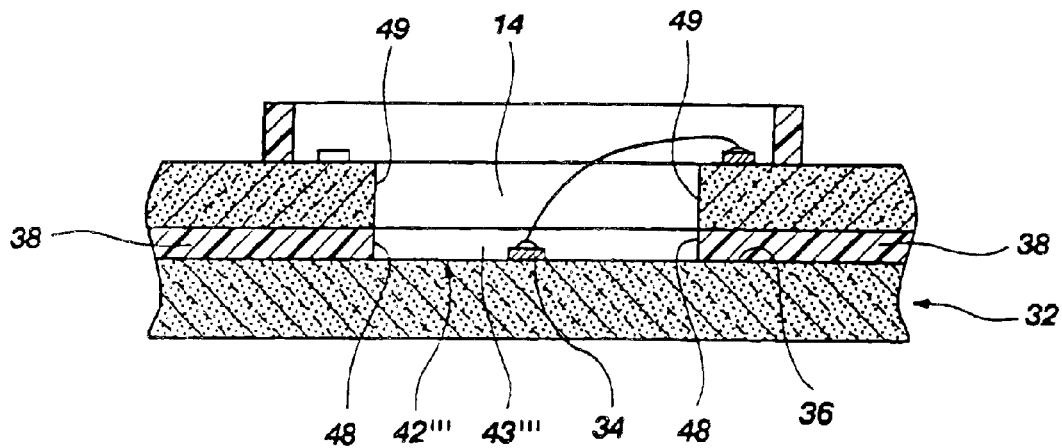
FIG. 6B is an enlarged, partial cross-sectional view of a package including the assembly shown in FIG. 3, depicting another variation of the sealing element illustrated in FIGS. 2–6.
Figure 7:
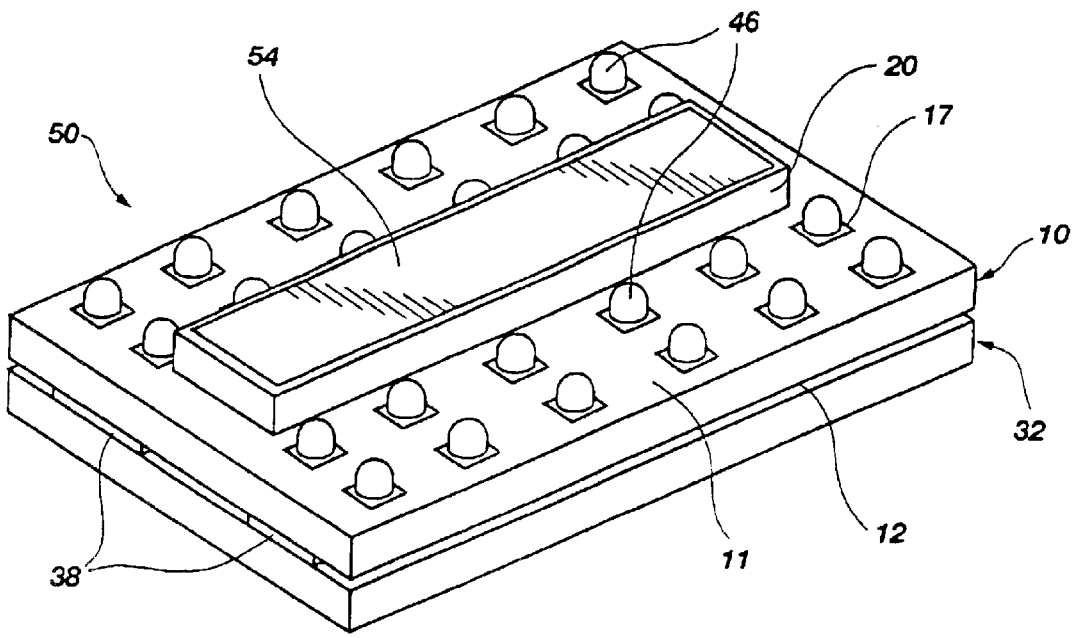
FIG. 7 is a perspective view of the semiconductor device package depicted in FIGS. 4–6.

FIG. 6A illustrates a variation of a sealing element 42″, which includes a vertically disposed end member 43″ that is continuous and integral with ends 45 of dam 20. Thus, a quantity of material 44″ forming each end member 43″ of sealing element 42" and each end 45 of dam 20 extends substantially vertically upward from active surface 36 of semiconductor die 32 and in contact with a corresponding end of slot 14. As shown in FIG. 6A, the long sides 47 of sealing element 42" are not continuous with the corresponding sides of dam 20. If, however, the edges 48 of adhesive film 38 strips are aligned with the long edges 49 of slot 14, as depicted in FIG. 6B, another variation of a sealing element 42''' incorporating teachings of the present invention, which includes end members 43''' similar to end members 43" illustrated in FIG. 6A, along with adhesive film 38 strips would substantially laterally seal bond pads 34 of semiconductor die 32, as well as any portions of active surface 36 that are covered by adhesive film 38 and sealing element 42'''.

As shown in FIG. 3, assembly 30 also includes a conductive structure or element 46 (e.g., balls, pillars, or other structures formed from metal, conductive elastomer, conductor-filled elastomer, or other conductive material) protruding from each second contact pad 17 of interposer 10.

Figure 8:
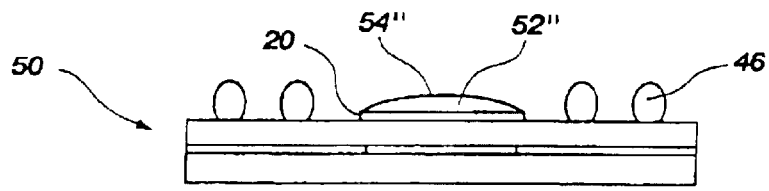
FIG. 8 is a side view of a variation of the semiconductor device package shown in FIGS. 4–7, wherein a shorter dam is secured to the interposer and a higher viscosity encapsulant material is used to encapsulate the intermediate conductive elements.

Turning now to FIGS. 4–7, a semiconductor device package 50 including assembly 30 of semiconductor die 32 and interposer 10 with dam 20 thereon is illustrated. Package 50 also includes a quantity of encapsulant material 52 disposed laterally within the confines of the one or more upwardly protruding dams 20 positioned on upper surface 11 of interposer 10 and over at least slot 14, intermediate conductive elements 40, and first contact pads 15. Encapsulant material 52 substantially encapsulates intermediate conductive elements 40 so as to electrically insulate intermediate conductive elements 40 from one another and from the exterior of package 50. As illustrated in FIGS. 2–7, upwardly protruding dam 20 completely laterally surrounds slot 14 and first contact pads 15. Thus, upwardly protruding dam 20 will laterally confine encapsulant materials 52 of any viscosity, including conventional glob-top materials such as silicones, as well as very low viscosity encapsulant materials 52. As a result, encapsulant material 52 of package 50 has a surface 54 that is less convexly curved than that exhibited by conventional glob-tops. As shown in FIGS. 4–7, encapsulant material 52 of package 50 exhibits a substantially planar surface 54. Since surface 54 may be substantially planar, the overall thickness of package 50 is reduced relative to packages that employ conventional glob-top type encapsulant materials of greater viscosity and thus having convexly curved surfaces 54. In addition, when surface 54 is substantially planar, encapsulant material 52 is not as likely as a semiconductor device package with a convexly curved glob-top type encapsulant to interfere with the flip-chip connection of conductive structures 46 to the terminals of a higher level substrate. By way of contrast, FIG. 8 illustrates a package 50 wherein a higher viscosity encapsulant material 52" is used and surface 54", therefore, has a convex shape, or meniscus. When a higher viscosity encapsulant material is used, the height of dam 20 need not exceed the height of bond wires or other intermediate conductive elements 40 (see FIGS. 3 and 4) extending through slot 14 (see FIGS. 3 and 4).

Figure 9:
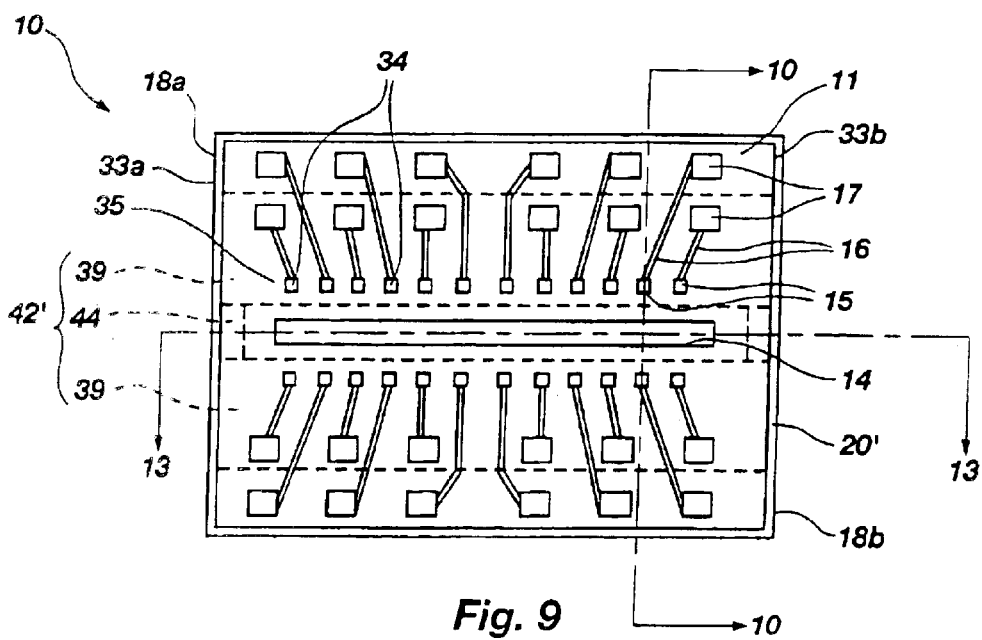
FIG. 9 is a top view of another interposer with a slot formed therethrough and an upwardly protruding dam secured to a surface of the interposer adjacent an outer periphery of the interposer.

FIG. 9 schematically depicts a second embodiment of a dam 20' incorporating teachings of the present invention disposed on an upper surface 11 of an interposer 10. Dam 20' is configured to be positioned adjacent outer periphery 18 (see FIG. 2) of interposer 10 and to at least partially laterally surround slot 14, first contact pads 15, and second contact pads 17. As illustrated, dam 20' substantially completely laterally surrounds slot 14, first contact pads 15, and second contact pads 17.

Figure 10:
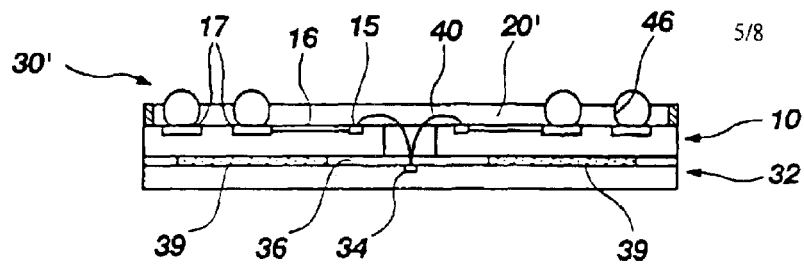
FIG. 10 is a cross-sectional view of an assembly including the interposer and upwardly protruding dam shown in FIG. 9, taken along line X—X thereof, and a semiconductor die connected thereto.

Referring to FIG. 10, an assembly 30' of a semiconductor die 32 and interposer 10 with dam 20' protruding upwardly therefrom is illustrated. Interposer 10 is secured to active surface 36 of semiconductor die 32 by way of a quantity of adhesive 39 disposed between active surface 36 and lower surface (not shown) of interposer 10. Intermediate conductive elements 40 electrically connect bond pads 34 of semiconductor die 32 to corresponding first contact pads 15 of interposer 10.

Figure 11:
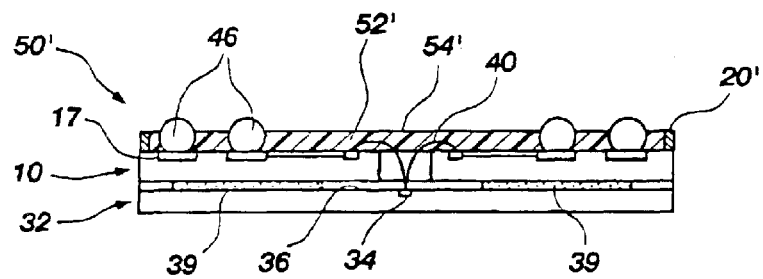
FIG. 11 is a cross-sectional view of a semiconductor device package including the assembly shown in FIG. 10, an encapsulant disposed over a surface of the interposer and laterally confined by the upwardly protruding dam, and a sealing element disposed between the interposer and the semiconductor die and laterally surrounding the bond pads of the die.
Figure 12:
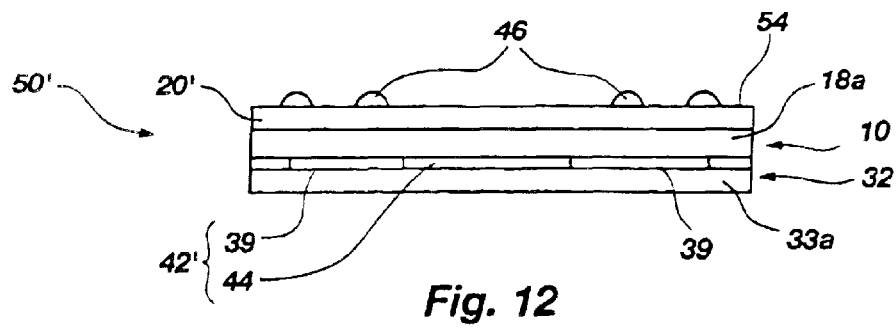
FIG. 12 is a side view of the semiconductor device package shown in FIG. 11.

Referring now to FIGS. 9 and 12, assembly 30' may also include a sealing element 42' located between semiconductor die 32 and interposer 10 and completely laterally surrounding bond pads 34 and substantially laterally sealing bond pads 34 from the environment external a semiconductor device package 50' (see FIGS. 11–14) that includes assembly 30'. Sealing element 42' may be at least partially formed by adhesive 39. Alternatively, or in addition, sealing element 42' may include a quantity of material 44, such as a photopolymer, disposed between active surface 36 of semiconductor die 32 and lower surface 12 of interposer 10. Preferably, material 44 is a photopolymer. FIGS. 9 and 12 depict sealing element 42' as including two elongate strips of adhesive 39 extending adjacent and substantially parallel to row 35 of bond pads 34. Sealing element 42' also includes material 44 located between strips of adhesive 39 adjacent (e.g., beneath) opposite, outer peripheral edges 18a, 18b of interposer 10 or adjacent opposite peripheral edges 33a, 33b of semiconductor die 32.

FIG. 10 also illustrates assembly 30' as including conductive structures 46 (e.g., balls, pillars, or other structures formed from metal, conductive elastomer, conductor-filled elastomer, or other conductive material) protruding from each second contact pad 17 of interposer 10.

Referring now to FIGS. 11–14, a semiconductor device package 50' including assembly 30' with semiconductor die 32, interposer 10, and dam 20' is illustrated. Package 50' also includes a glob-top type encapsulant 52' formed from a known type of encapsulant material, disposed laterally within the confines of the one or more upwardly protruding dams 20' positioned on upper surface 11 of interposer 10 so as to fill slot 14 and to be disposed thereover, as well as over intermediate conductive elements 40, first contact pads 15, and second contact pads 17. Encapsulant 52' substantially encapsulates intermediate conductive elements 40 so as to electrically insulate intermediate conductive elements 40 from one another and from the exterior of package 50'. Encapsulant 52' also laterally surrounds and supports a base portion of each conductive structure 46, at the junction of conductive structure 46 and the corresponding second contact pad 17 to which conductive structure 46 is secured. When dam 20' completely laterally surrounds second contact pads 17, a low viscosity encapsulant material may be used as encapsulant 52'. Thus, encapsulant 52' would have a substantially planar surface 54' and each conductive structure 46 would protrude substantially the same distance from surface 54' of encapsulant 52'.

Figure 15:
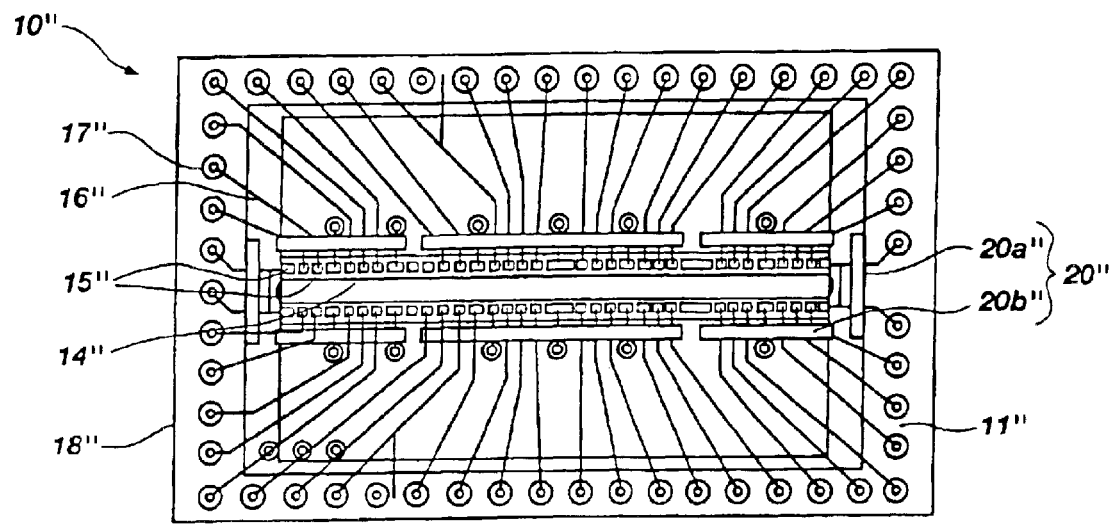
FIG. 15 is a top schematic representation of an interposer with another embodiment of dam, including a plurality of separate elements secured to the surface of the interposer adjacent a centrally located, elongate slot formed therethrough.

FIG. 15 depicts another embodiment of dam 20" incorporating teachings of the present invention. As shown in FIG. 15, dam 20" includes several separate dam elements 20a", 20b", etc. that are each secured to an upper surface 11" of an interposer 10". Each dam element 20a", 20b", etc. is positioned adjacent a substantially centrally located elongate slot 14" formed through interposer 10". First contact pads 15" are positioned adjacent slot 14", between slot 14" and dam 20", and are connected by way of conductive traces 16" to corresponding second contact pads 17" that are positioned adjacent an outer periphery 18" of interposer 10". Although dam elements 20*a*", 20*b*", etc. are spaced apart from one another, dam 20" will laterally confine higher viscosity encapsulant materials (e.g., conventional glob-top type encapsulants) over slot 14" and any intermediate conductive elements extending therethrough.

Figure 16:
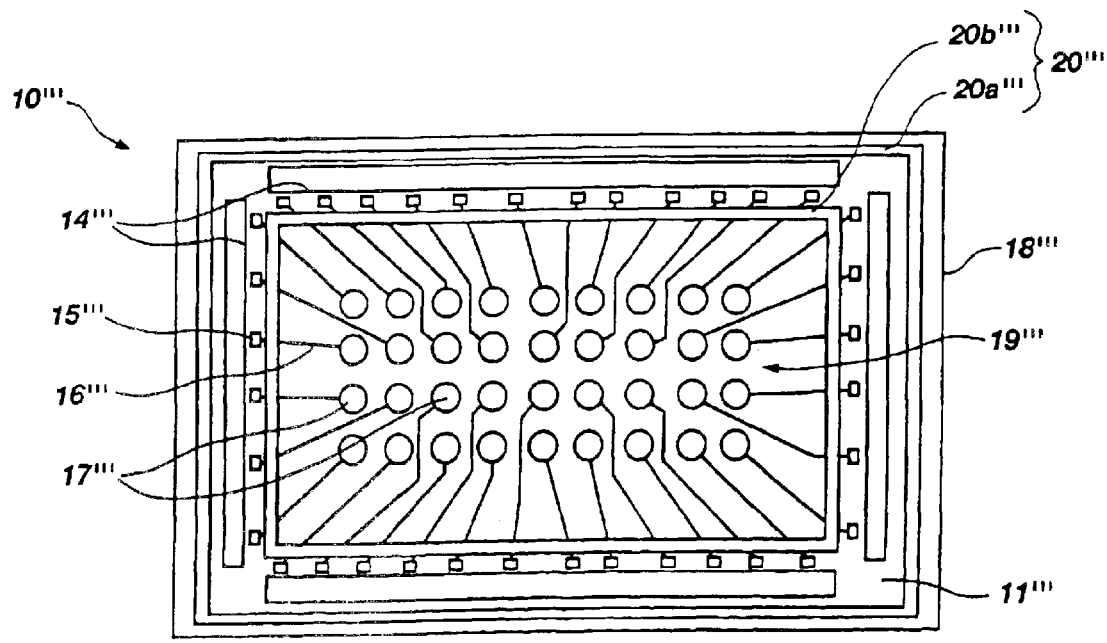
FIG. 16 is a top schematic representation of an interposer with another embodiment of a dam secured to a surface thereof, the interposer including peripherally located slots and centrally located contact pads, the dam including two upwardly protruding members configured and positioned to confine encapsulant material over the peripherally located slots of the interposer and to prevent encapsulant material from flowing onto the centrally located contact pads or onto conductive structures secured to the contact pads.

Another embodiment of a dam 20''' according to the present invention is illustrated in FIG. 16. Dam 20''' includes an outer member 20*a*''' and an inner member 20*b*''' that are positioned concentrically relative to one another. As FIG. 16 shows, dam 20''' is useful on an interposer 10''' with slots 14''' therethrough and located adjacent outer periphery 18''' to contain encapsulant material over slots 14'''. Slots 14''' are located upon interposer 10''' to align over the peripherally located bond pads of a semiconductor die to be assembled with interposer 10'''. Interposer 10''' is configured to reroute the bond pad locations from their peripheral locations on the semiconductor die to an array over a surface of interposer 10'''. Accordingly, interposer 10''' includes first contact pads 15''' positioned adjacent slots 14''' and connected by way of conductive traces 16''' to corresponding second contact pads 17''' disposed in an array across the center 19''' of an upper surface 11''' of interposer 10'''. Conductive elements connecting the bond pads of a semiconductor die to first contact pads 15''' of interposer 10''' may be encapsulated by disposing an encapsulant material between outer member 20*a*''' of dam 20''' and inner member 20*b*''' thereof.

While dams 20, 20', 20", 20''' are preferably substantially simultaneously fabricated on or secured to a collection of interposers 10, 10", 10''', such as prior to singulating interposers 10, 10", 10''' from a wafer, dams 20, 20', 20", 20''' may also be fabricated on or secured to collections of individual interposers 10, 10", 10''' or other substrates, or to individual interposers 10, 10", 10''' or other substrates. As another alternative, dams 20, 20', 20", 20''' may be substantially simultaneously fabricated on or secured to a collection of more than one type of interposer 10, 10', 10" or another substrate.

Dams 20, 20', 20", 20''' may be fabricated directly on interposers 10, 10", 10''' or other substrates. Alternatively, dams 20, 20', 20", 20''' may be fabricated separately from interposers 10, 10', 10" or other substrates, then secured thereto as known in the art, such as by the use of a suitable adhesive.

While any known semiconductor device fabrication technique may be used to fabricate dams 20, 20', 20", 20''' (e.g., forming and patterning a layer of material, such as silicon dioxide or a photoresist), dams 20, 20', 20", 20''' are preferably fabricated from a photo-curable polymer, or "photopolymer," by stereolithographic processes. When fabricated directly on an interposer 10, 10", 10''' or other substrate, dams 20, 20', 20", 20''' may be made either before or after interposer 10, 10", 10''' has been assembled with a semiconductor die 32.

Photopolymer portions of sealing element 42 may likewise be fabricated on an interposer 10, 10", 10''' or other substrate before or after assembly thereof with a semiconductor die 32, but are preferably fabricated on an assembly, such as assembly 30 (see FIG. 3) or assembly 30' (see FIG. 10), including an interposer 10, 10", 10''' or other substrate and a semiconductor die 32.

For simplicity, the ensuing description is limited to an explanation of a method of fabricating dams 20 on an interposer 10 prior to securing conductive structures 46 to contact pads 15 of interposer 10. As should be appreciated by those of skill in the art, however, the method described herein is also useful for fabricating dams 20', 20", 20''', as well as other embodiments of dams incorporating teachings of the present invention, on an interposer 10, 10", 10''' or other substrate.

Stereolithography Apparatus and Methods

Figure 17:
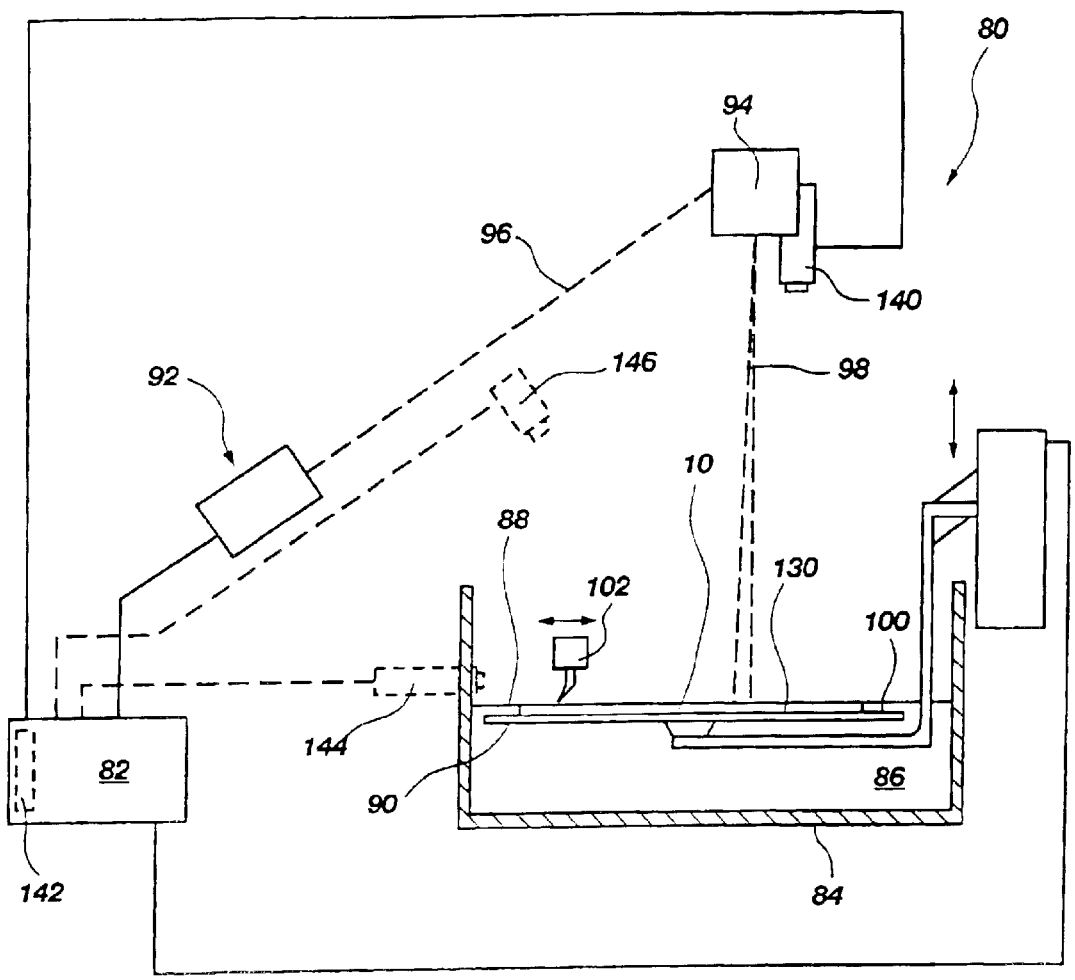
FIG. 17 is a schematic representation of an exemplary stereolithography apparatus that may be employed in the method of the present invention to fabricate the dams of the present invention.

FIG. 17 schematically depicts various components, and operation, of an exemplary stereolithography apparatus 80 to facilitate the reader's understanding of the technology employed in implementation of the method of the present invention, although those of ordinary skill in the art will understand and appreciate that apparatus of other designs and manufacture may be employed in practicing the method of the present invention. The preferred, basic stereolithography apparatus for implementation of the method of the present invention, as well as operation of such apparatus, are described in great detail in United States Patents assigned to 3 D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by this reference.

With continued reference to FIG. 17 and as noted above, a 3-D CAD drawing of an object to be fabricated in the form of a data file is placed in the memory of a computer 82 controlling the operation of stereolithography apparatus 80 if computer 82 is not a CAD computer in which the original object design is effected. In other words, an object design may be effected in a first computer in an engineering or research facility and the data files transferred via wide or local area network, tape, disc, CD-ROM, or otherwise as known in the art to computer 82 of stereolithography apparatus 80 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so translation from another internal geometric database format is often unnecessary. In an STL file, the boundary surfaces of an object are defined as a mesh of interconnected triangles.

Stereolithography apparatus 80 also includes a reservoir 84 (which may comprise a removable reservoir interchangeable with others containing different materials) of an unconsolidated material 86 to be employed in fabricating the intended object. In the currently preferred embodiment, the unconsolidated material 86 is a liquid, photo-curable polymer, or "photopolymer," that cures in response to light in the UV wavelength range. The surface level 88 of unconsolidated material 86 is automatically maintained at an extremely precise, constant magnitude by devices known in the art responsive to output of sensors within apparatus 80 and preferably under control of computer 82. A support platform or elevator 90, precisely vertically movable in fine, repeatable increments responsive to control of computer 82, is located for movement downward into and upward out of material 86 in reservoir 84.

Figure 18:
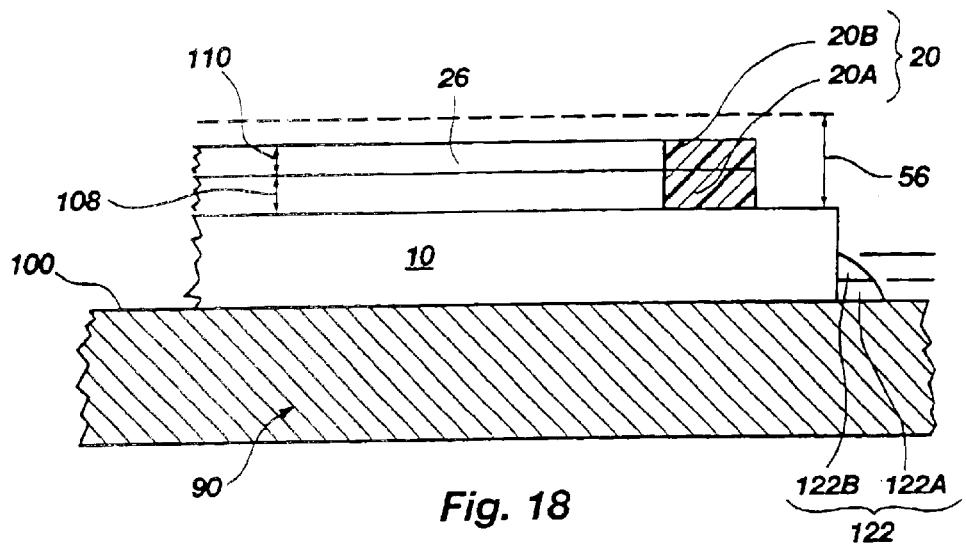
FIG. 18 is a partial cross-sectional side view of an interposer or other substrate disposed on a platform of a stereolithographic apparatus for the formation of a dam on the interposer or other substrate.

An object may be fabricated directly on platform 90, or on a substrate disposed on platform 90. When the object is to be fabricated on a substrate disposed on platform 90, the substrate may be positioned on platform 90 and secured thereto by way of one or more base supports 122 (FIG. 18). Such base supports 122 may be fabricated before or simultaneously with the stereolithographic fabrication of one or more objects on platform 90 or a substrate disposed thereon. These base supports 122 may support, or prevent lateral movement of, the substrate relative to a surface 100 of platform 90. Base supports 122 may also provide a perfectly horizontal reference plane for fabrication of one or more objects thereon, as well as facilitate the removal of a substrate from platform 90 following the stereolithographic fabrication of one or more objects on the substrate. Moreover, where a so-called "recoater" blade 102 is employed to form a layer of material on platform 90 or a substrate disposed thereon, base supports 122 may preclude inadvertent contact of recoater blade 102, to be described in greater detail below, with surface 100 of platform 90.

Stereolithography apparatus 80 has a UV wavelength range laser plus associated optics and galvanometers (collectively identified as laser 92) for controlling the scan of laser beam 96 in the X-Y plane across platform 90. Laser 92 has associated therewith a mirror 94 to reflect beam 96 downwardly as beam 98 toward surface 100 of platform 90. Beam 98 is traversed in a selected pattern in the X-Y plane, that is to say, in a plane parallel to surface 100, by initiation of the galvanometers under control of computer 82 to at least partially cure, by impingement thereon, selected portions of material 86 disposed over surface 100 to at least a partially consolidated (e.g., semisolid) state. The use of mirror 94 lengthens the path of the laser beam, effectively doubling same, and provides a more vertical beam 98 than would be possible if the laser 92 itself were mounted directly above platform surface 100, thus enhancing resolution.

Referring now to FIGS. 17 and 18, data from the STL files resident in computer 82 is manipulated to build an object, such as a dam 20, various configurations of which are illustrated in FIGS. 2–16, or base supports 122, one layer at a time. Accordingly, the data mathematically representing one or more of the objects to be fabricated are divided into subsets, each subset representing a slice or layer of the object. The division of data is effected by mathematically sectioning the 3-D CAD model into at least one layer, a single layer or a "stack" of such layers representing the object. Each slice may be from about 0.0001 to about 0.0300 inch thick. As mentioned previously, a thinner slice promotes higher resolution by enabling better reproduction of fine vertical surface features of the object or objects to be fabricated.

When one or more base supports 122 are to be stereolithographically fabricated, base supports 122 may be programmed as a separate STL file from the other objects to be fabricated. The primary STL file for the object or objects to be fabricated and the STL file for base support(s) 122 are merged.

Before fabrication of a first layer for a base support 122 or an object to be fabricated is commenced, the operational parameters for stereolithography apparatus 80 are set to adjust the size (diameter if circular) of the laser light beam used to cure material 86. In addition, computer 82 automatically checks and, if necessary, adjusts by means known in the art the surface level 88 of material 86 in reservoir 84 to maintain same at an appropriate focal length for laser beam 98. U.S. Pat. No. 5,174,931, referenced above and previously incorporated herein by reference, discloses one suitable level-control system. Alternatively, the height of mirror 94 may be adjusted responsive to a detected surface level to cause the focal point of laser beam 98 to be located precisely at surface level 88 of material 86 if surface level 88 is permitted to vary, although this approach is more complex. Platform 90 may then be submerged in material 86 in reservoir 84 to a depth equal to the thickness of one layer or slice of the object to be formed, and the liquid surface level 88 is readjusted as required to accommodate material 86 displaced by submergence of platform 90. Laser 92 is then activated so laser beam 98 will scan unconsolidated (e.g., liquid or powdered) material 86 disposed over surface 100 of platform 90 to at least partially consolidate (e.g., polymerize to at least a semisolid state) material 86 at selected locations, defining the boundaries of a first layer 122A of base support 122 and filling in solid portions thereof. Platform 90 is then lowered by a distance equal to a thickness of second layer 122B, and laser beam 98 scanned over selected regions of the surface of material 86 to define and fill in the second layer 122B while simultaneously bonding the second layer to the first. The process may then be repeated, as often as necessary, layer by layer, until base support 122 is completed. Platform 90 is then moved relative to mirror 94 to form any additional base support 122 on platform 90 or a substrate disposed thereon or to fabricate objects upon platform 90, base support 122, or a substrate, as provided in the control software. The number of layers required to erect base support 122 or one or more other objects to be formed depends upon the height of the object or objects to be formed and the desired layer thickness 108, 110. The layers of a stereolithographically fabricated structure with a plurality of layers may have different thicknesses.

If a recoater blade 102 is employed, the process sequence is somewhat different. In this instance, surface 100 of platform 90 is lowered into unconsolidated (e.g., liquid) material 86 below surface level 88 a distance greater than a thickness of a single layer of material 86 to be cured, then raised above surface level 88 until platform 90, a substrate disposed thereon, or a structure being formed on platform 90 is precisely one layer's thickness below blade 102. Blade 102 then sweeps horizontally over platform 90 or (to save time) at least over a portion thereof on which one or more objects are to be fabricated to remove excess material 86 and leave a film of precisely the desired thickness. Platform 90 is then lowered so that the surface of the film and surface level 88 are coplanar and the surface of the unconsolidated material 86 is still. Laser 92 is then initiated to scan with laser beam 98 and define the first layer 130. The process is repeated, layer by layer, to define each succeeding layer 130 and simultaneously bond same to the next lower layer 130 until all of the layers of the object or objects to be fabricated are completed. A more detailed discussion of this sequence and apparatus for performing same is disclosed in U.S. Pat. No. 5,174,931, previously incorporated herein by reference.

As an alternative to the above approach to preparing a layer of material 86 for scanning with laser beam 98, a layer of unconsolidated (e.g., liquid) material 86 may be formed on surface 100 of support platform 90, on a substrate disposed on platform 90, or on one or more objects being fabricated by lowering platform 90 to flood material 86 over surface 100, over a substrate disposed thereon, or over the highest completed layer of the object or objects being formed, then raising platform 90 and horizontally traversing a so-called "meniscus" blade horizontally over platform 90 to form a layer of unconsolidated material having the desired thickness over platform 90, the substrate, or each of the objects being formed. Laser 92 is then initiated and a laser beam 98 scanned over the layer of unconsolidated material to define at least the boundaries of the solid regions of the next higher layer of the object or objects being fabricated.

Yet another alternative to layer preparation of unconsolidated (e.g., liquid) material 86 is to merely lower platform 90 to a depth equal to that of a layer of material 86 to be scanned, and to then traverse a combination flood bar and meniscus bar assembly horizontally over platform 90, a substrate disposed on platform 90, or one or more objects being formed to substantially concurrently flood material 86 thereover and to define a precise layer thickness of material 86 for scanning.

All of the foregoing approaches to liquid material flooding and layer definition and apparatus for initiation thereof are known in the art and are not material to practice of the present invention, so no further details relating thereto will be provided herein.

In practicing the present invention, a commercially available stereolithography apparatus operating generally in the manner as that described above with respect to stereolithography apparatus 80 of FIG. 17 is preferably employed, but with further additions and modifications as hereinafter described for practicing the method of the present invention. For example and not by way of limitation, the SLA-250/50HR, SLA-5000 and SLA-7000 stereolithography systems, each offered by 3D Systems, Inc, of Valencia, Calif., are suitable for modification. Photopolymers believed to be suitable for use in practicing the present invention include Cibatool SL 5170 and SL 5210 resins for the SLA-250/50HR system, Cibatool SL 5530 resin for the SLA-5000 and 7000 systems, and Cibatool SL 7510 resin for the SLA-7000 system. All of these photopolymers are available from Ciba Specialty Chemicals Inc.

By way of example and not limitation, the layer thickness of material 86 to be formed, for purposes of the invention, may be on the order of about 0.0001 to 0.0300 inch, with a high degree of uniformity. It should be noted that different material layers may have different heights, so as to form a structure of a precise, intended total height or to provide different material thicknesses for different portions of the structure. The size of the laser beam "spot" impinging on surface level 88 of material 86 to cure same may be on the order of 0.001 inch to 0.008 inch. Resolution is preferably ±0.0003 inch in the X-Y plane (parallel to surface 100) over at least a 0.5 inch×0.25 inch field from a center point, permitting a high resolution scan effectively across a 1.0 inch×0.5 inch area. Of course, it is desirable to have substantially this high a resolution across the entirety of surface 100 of platform 90 to be scanned by laser beam 98, such area being termed the field of exposure," such area being substantially coextensive with the vision field of a machine vision system employed in the apparatus of the invention as explained in more detail below. The longer and more effectively vertical the path of laser beam 96/98, the greater the achievable resolution.

Referring again to FIG. 17, it should be noted that stereolithography apparatus 80 useful in the method of the present invention includes a camera 140 which is in communication with computer 82 and preferably located, as shown, in close proximity to optics and mirror 94 located above surface 100 of support platform 90. Camera 140 may be any one of a number of commercially available cameras, such as capacitive-coupled discharge (CCD) cameras available from a number of vendors. Suitable circuitry as required for adapting the output of camera 140 for use by computer 82 may be incorporated in a board 142 installed in computer 82, which is programmed as known in the art to respond to images generated by camera 140 and processed by board 142. Camera 140 and board 142 may together comprise a so-called "machine vision system" and, specifically, a "pattern recognition system" (PRS), the operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

Stereolithographic Fabrication of the Dams

In order to facilitate fabrication of one or more dams 20 in accordance with the method of the present invention with apparatus 80, a data file representative of the size, configuration, thickness and surface topography of, for example, a particular type and design of interposer 10 or other substrate upon which one or more dams 20 are to be mounted is placed in the memory of computer 82. Also, if it is desired that the dams 20 be so positioned on interposer 10 or another substrate taking into consideration features of a higher-level substrate to which a semiconductor device package (e.g., packages 50, 50' shown in FIGS. 4–7 and 11–14, respectively) including interposer 10 is to be connected, a data file representative of the higher-level substrate and the features thereof may be placed in memory.

One or more interposers 10 or other substrates may be placed on surface 100 of platform 90 for fabrication of dams 20 thereon. If one or more interposers 10 or other substrates are to be held on or supported above platform 90 by stereolithographically formed base supports 122, one or more layers of material 86 are sequentially disposed on surface 100 and selectively altered by use of laser 92 to form base supports 122.

Camera 140 is then activated to locate the position and orientation of each interposer 10 or other substrate upon which dams 20 are to be fabricated. The features of each interposer 10 or other substrate are compared with those in the data file residing in memory, the locational and orientational data for each interposer or other substrate then also being stored in memory. It should be noted that the data file representing the design size, shape and topography for each interposer 10 or other substrate may be used at this juncture to detect physically defective or damaged interposers 10 or other substrates prior to fabricating dams 20 thereon or before conducting further processing or assembly of interposers 10 with other semiconductor device components. Accordingly, such damaged or defective interposers 10 or other substrates may be deleted from the process of fabricating dams 20, from further processing, or from assembly with other components. It should also be noted that data files for more than one type (size, thickness, configuration, surface topography) of each interposer or other substrate may be placed in computer memory and computer 82 programmed to recognize not only the locations and orientations of each interposer 10 or other substrate, but also the type of interposer 10 or other substrate at each location upon platform 90 so that material 86 may be at least partially consolidated by laser beam 98 in the correct pattern and to the height required to define dams 20 in the appropriate, desired locations on each interposer 10 or other substrate.

Continuing with reference to FIGS. 17 and 18, the one or more interposers 10 or other substrates on platform 90 may then be submerged partially below the surface level 88 of unconsolidated material 86 to a depth greater than the thickness of a first layer of material 86 to be at least partially consolidated (e.g., cured to at least a semisolid state) to form the lowest layer 130 of each dam 20 at the appropriate location or locations on each interposer 10 or other substrate, then raised to a depth equal to the layer thickness, surface level 88 of material 86 being allowed to become calm. Photopolymers that are useful as material 86 exhibit a desirable dielectric constant, low shrinkage upon cure, are of sufficient (i.e., semiconductor grade) purity, exhibit good adherence to other semiconductor device materials, and have a similar coefficient of thermal expansion (CTE) to the material of interposer 10 or another substrate which material 86 contacts. Preferably, the CTE of material 86 is sufficiently similar to that of interposer 10 or another substrate to prevent undue stressing thereof during thermal cycling of a semiconductor device assembly or package including interposer 10 in testing, subsequent processing, and subsequent normal operation. Exemplary photopolymers exhibiting these properties are believed to include, but are not limited to, the above-referenced resins from Ciba Specialty Chemicals Inc. One area of particular concern in determining resin suitability is the substantial absence of mobile ions, and specifically fluorides.

Laser 92 is then activated and scanned to direct beam 98, under control of computer 82, toward specific locations of surface level 88 relative to each interposer 10 or other substrate to effect the aforementioned partial cure of material 86 to form a first layer 20A of each dam 20. Platform 90 is then lowered into reservoir 84 and raised a distance equal to the desired thickness of another layer 20B of each dam 20, and laser 92 is activated to add another layer 20B to each dam 20 under construction. This sequence continues, layer by layer, until each of the layers of each dam 20 have been completed.

In FIG. 18, the first layer of dam 20 is identified by numeral 20A, and the second layer is identified by numeral 20B. Likewise, the first layer of base support 122 is identified by numeral 122A and the second layer thereof is identified by numeral 122B. As illustrated, both base support 122 and dam 20 have only two layers. Dams 20 with any number of layers are, however, within the scope of the present invention. The use of a large number of layers may be employed to substantially simulate the curvature of a solder ball to be encompassed thereby.

Each layer 20A, 20B of dam 20 is preferably built by first defining any internal and external object boundaries of that layer with laser beam 98, then hatching solid areas of dam 20 located within the object boundaries with laser beam 98. An internal boundary of a layer may comprise aperture 26, a through-hole, a void, or a recess in dam 20, for example. If a particular layer includes a boundary of a void in the object above or below that layer, then laser beam 98 is scanned in a series of closely spaced, parallel vectors so as to develop a continuous surface, or skin, with improved strength and resolution. The time it takes to form each layer depends upon the geometry thereof, the surface tension and viscosity of material 86, and the thickness of that layer.

Alternatively, dams 20 may each be formed as a partially cured outer skin extending above a surface of interposer 10 or another substrate and forming a dam within which unconsolidated material 86 may be contained. This may be particularly useful where the dams 20 protrude a relatively high distance 56 from the surface of interposer 10 or another substrate. In this instance, support platform 90 may be submerged so that material 86 enters the area within dam 20, raised above surface level 88, and then laser beam 98 activated and scanned to at least partially cure material 86 residing within dam 20 or, alternatively, to merely cure a "skin," a final cure of the material of the dams 20 being effected subsequently by broad-source UV radiation in a chamber, or by thermal cure in an oven. In this manner, dams 20 of extremely precise dimensions may be formed of material 86 by stereolithography apparatus 80 in minimal time.

Once dams 20, or at least the outer skins thereof, have been fabricated, platform 90 is elevated above surface level 88 of material 86 and platform 90 is removed from stereolithography apparatus 80, along with any substrate (e.g., interposer 10) disposed thereon and any stereolithographically fabricated structures, such as dams 20. Excess, unconsolidated material 86 (e.g., excess uncured liquid) may be manually removed from platform 90, from any substrate disposed thereon, and from dams 20. Each interposer 10 or other substrate is removed from platform 90, such as by cutting the substrate free of base supports 122. Alternatively, base supports 122 may be configured to readily release each interposer 10 or other substrate. As another alternative, a solvent may be employed to release base supports 122 from platform 90. Such release and solvent materials are known in the art. See, for example, U.S. Pat. No. 5,447,822 referenced above and previously incorporated herein by reference.

Dams 20 and interposers 10 or other substrates may also be cleaned by use of known solvents that will not substantially degrade, deform, or damage dams 20, interposers 10, or other substrates to which dams 20 are secured.

As noted previously, dams 20 may then require postcuring. Dams 20 may have regions of unconsolidated material contained within a boundary or skin thereof, or material 86 may be only partially consolidated (e.g., polymerized or cured) and exhibit only a portion (typically 40% to 60%) of its fully consolidated strength. Postcuring to completely harden dams 20 may be effected in another apparatus projecting UV radiation in a continuous manner over dams 20 or by thermal completion of the initial, UV-initiated partial cure.

It should be noted that the height, shape, or placement of each dam 20 on each specific interposer 10 or other substrate may vary, again responsive to output of camera 140 or one or more additional cameras 144 or 146, shown in broken lines, detecting the protrusion of unusually high (or low) preplaced solder balls which could affect the desired distance 56 that dams 20 will protrude from the surface of interposer 10 or another substrate. In any case, laser 92 is again activated to at least partially cure material 86 residing on each interposer 10 or other substrate to form the layer or layers of each dam 20.

Although FIGS. 17 and 18 illustrate the stereolithographic fabrication of dams 20 on a substrate, such as an interposer 10, dams 20 may be fabricated separately from a substrate, then secured to a substrate by known processes, such as by the use of a suitable adhesive material.

The use of a stereolithographic process as exemplified above to fabricate dams 20 is particularly advantageous since a large number of dams 20 may be fabricated in a short time, the dam height and position are computer controlled to be extremely precise, wastage of unconsolidated material 86 is minimal, solder coverage of passivation materials is avoided, and the stereolithography method requires minimal handling of interposers 10 or other substrates.

Stereolithography is also an advantageous method of fabricating dams 20 according to the present invention since stereolithography may be conducted at substantially ambient temperature, the small spot size and rapid traverse of laser beam 98 resulting in negligible thermal stress upon a substrate, such as interposer 10, or on the electrical traces 16 or contact pads 15, 17 thereof.

The stereolithography fabrication process may also advantageously be conducted at the wafer level or on multiple substrates, saving fabrication time and expense. As the stereolithography method of the present invention recognizes specific types of interposers 10 or other substrates, variations between individual interposers 10 or other substrates are accommodated. Accordingly, when the stereolithography method of the present invention is employed, dams 20 may be simultaneously fabricated on different types of interposers 10 or other substrates.

While the present invention has been disclosed in terms of certain preferred embodiments, those of ordinary skill in the art will recognize and appreciate that the invention is not so limited. Additions, deletions and modifications to the disclosed embodiments may be effected without departing from the invention claimed herein. Similarly, features from one embodiment may be combined with those of another while remaining within the scope of the invention.

What is claimed is:

1. A method for fabricating an interposer, comprising:
   providing at least one interposer substrate that includes at least one slot therethrough; and
   forming at least one upwardly protruding dam at least partially around the at least one slot on an opposite surface of the at least one interposer from a surface to which at least one semiconductor device associated with the at least one slot is to be secured.

2. The method of claim 1, wherein forming the at least one upwardly protruding dam comprises selectively consolidating material in accordance with a program.

3. The method of claim 2, wherein selectively consolidating material comprises stereolithographically forming the at least one upwardly protruding dam.

4. The method of claim 3, wherein stereolithographically forming the at least one upwardly protruding dam comprises sequentially forming a plurality of layers, at least partially superimposing adjacent layers of the plurality of layers, and securing the adjacent layers to one another.

5. The method of claim 1, further comprising:
   storing data including at least one physical parameter of the at least one upwardly protruding dam and using the data to effect forming the at least one upwardly protruding dam.

6. The method of claim 1, further comprising:
   storing data including at least one physical parameter of the at least one interposer substrate in computer memory.

7. The method of claim 6, further comprising:
   recognizing a location and orientation of the at least one interposer substrate to effect forming of the at least one upwardly protruding dam at a desired location.

8. The method of claim 7, wherein forming the at least one upwardly protruding dam comprises selectively consolidating material in accordance with a program.

9. The method of claim 8, wherein selectively consolidating material comprises stereolithographically forming the at least one upwardly protruding dam.

10. The method of claim 9, wherein stereolithographically forming the at least one upwardly protruding dam comprises sequentially forming a plurality of layers, at least partially superimposing adjacent layers of the plurality of layers, and securing the adjacent layers to one another.

11. The method of claim 7, wherein recognizing is effected with a machine vision system.

12. A method for fabricating an interposer, comprising:
    providing at least one interposer substrate that includes at least one slot or aperture therethrough; and
    selectively fabricating at least one upwardly protruding dam adjacent to at least a portion of the at least one slot or aperture under control of a program.

13. The method of claim 12, wherein selectively fabricating the at least one upwardly protruding dam comprises selectively consolidating material under control of the program.

14. The method of claim 13, wherein selectively consolidating material comprises stereolithographically forming the at least one upwardly protruding dam.

15. The method of claim 14, wherein stereolithographically forming the at least one upwardly protruding dam comprises sequentially forming a plurality of layers, at least partially superimposing adjacent layers of the plurality of layers, and securing the adjacent layers to one another.

16. The method of claim 12, further comprising:
    storing data including at least one physical parameter of the at least one upwardly protruding dam and using the data to effect forming the at least one upwardly protruding dam.

17. The method of claim 13, further comprising:
    storing data including at least one physical parameter of the at least one interposer substrate in computer memory.

18. The method of claim 17, further comprising:
    recognizing a location and orientation of the at least one interposer substrate to effect forming of the at least one upwardly protruding dam at a desired location.

19. The method of claim 18, wherein forming the at least one upwardly protruding dam comprises selectively consolidating material in accordance with a program.

20. The method of claim 19, wherein selectively consolidating material comprises stereolithographically forming the at least one upwardly protruding dam.

21. The method of claim 20, wherein stereolithographically forming the at least one upwardly protruding dam comprises sequentially forming a plurality of layers, at least partially superimposing adjacent layers of the plurality of layers, and securing the adjacent layers to one another.

22. The method of claim 18, wherein recognizing is effected with a machine vision system.

* * * * *

UNITED STATES PATENT AND TRADEMARK OFFICE
CERTIFICATE OF CORRECTION

| | | |
|---|---|---|
| PATENT NO. | : 7,041,532 B2 | Page 1 of 7 |
| APPLICATION NO. | : 10/787872 | |
| DATED | : May 9, 2006 | |
| INVENTOR(S) | : Ford B. Grigg | |

Figure 1:
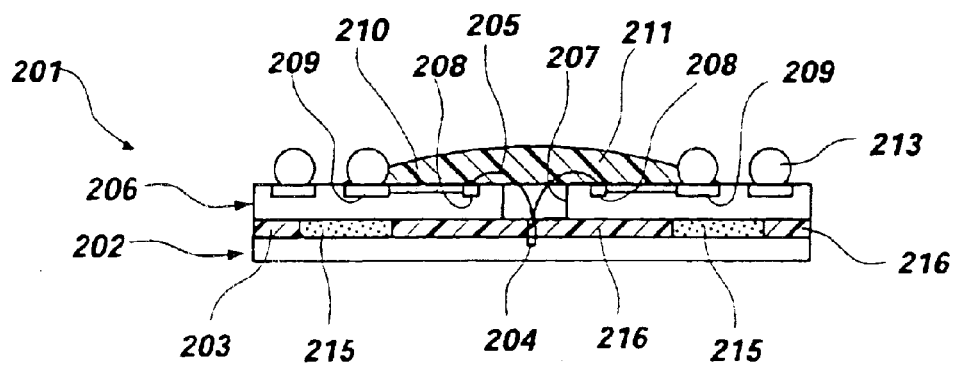
FIG. 1 is a cross-sectional view of an exemplary chip-scale package with a glob-top type encapsulant placed over the intermediate conductive elements thereof.

It is certified that error appears in the above-identified patent and that said Letters Patent is hereby corrected as shown below:

In the drawings:

In FIG. 1, redirect the lead line extending from reference numeral "203" in order to accurately indicate the active (top) surface of semiconductor die 202

In FIG. 9, add reference numeral --30-- with accompanying arrow, and change two occurrences of "10" at the ends of the hashed arrows on the right-hand side of the drawing to --X--

Figure 13:
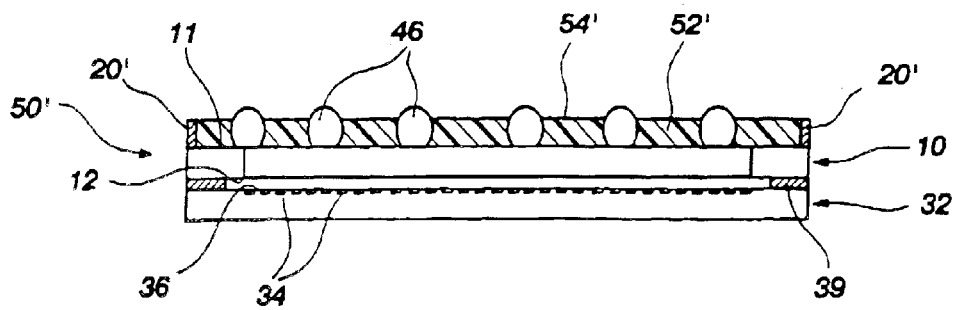
FIG. 13 is another cross-sectional view of the semiconductor device package shown in FIGS. 11 and 12, which includes the interposer shown in FIG. 9, the cross-section being taken along line 13—13 of FIG. 9.
Figure 14:
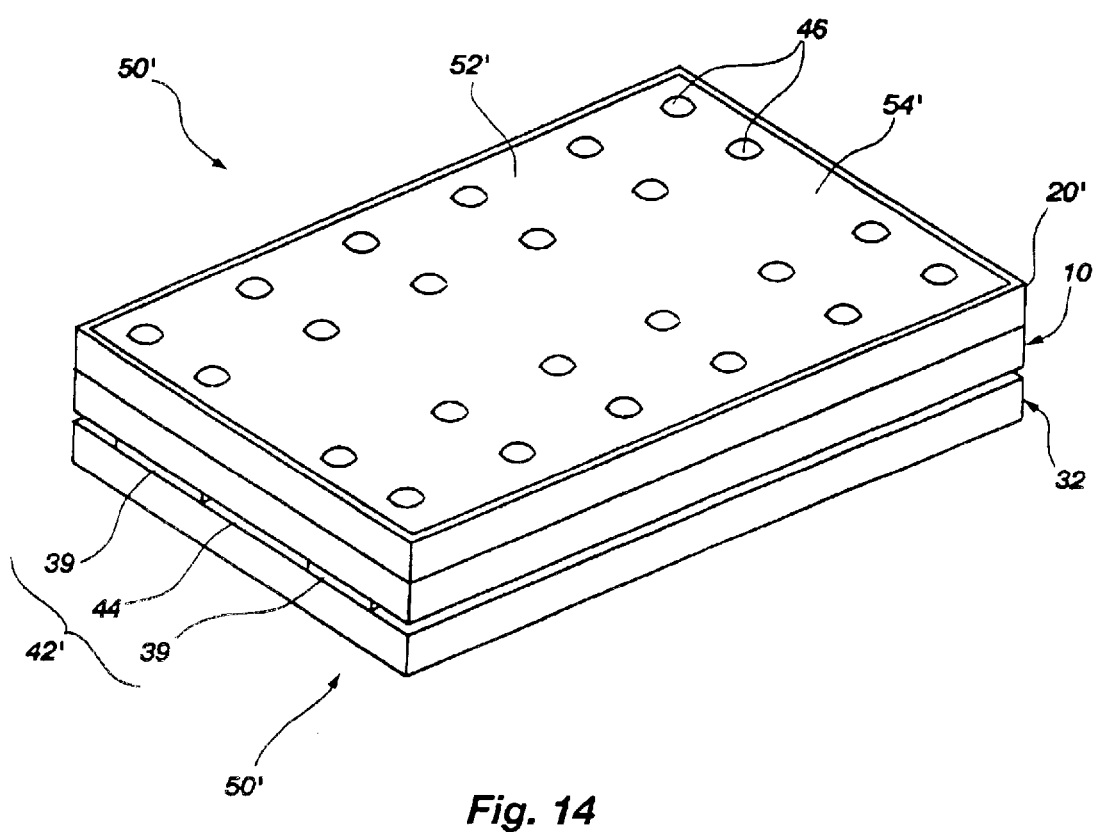
FIG. 14 is a perspective view of the semiconductor device package depicted in FIGS. 11–13.

In FIG. 11, add the reference numeral --14-- with accompanying lead line, and add reference numeral --30'-- with accompanying arrow In FIG. 12, change reference numeral " 50' " to --30'--, change reference numeral "54" to --54'--, add reference numeral --12-- with accompanying lead line, and add reference numeral --50'-- with accompanying arrow In FIG. 13, add reference numeral --30'-- with accompanying bracket In FIG. 14, delete the lowermost occurrence of reference numeral "50" together with its corresponding arrow, and add reference numeral --30'-- with accompanying bracket

UNITED STATES PATENT AND TRADEMARK OFFICE
CERTIFICATE OF CORRECTION

PATENT NO. : 7,041,532 B2
APPLICATION NO. : 10/787872
DATED : May 9, 2006
INVENTOR(S) : Ford B. Grigg It is certified that error appears in the above-identified patent and that said Letters Patent is hereby corrected as shown below:

Replace FIG. 1 with the following:

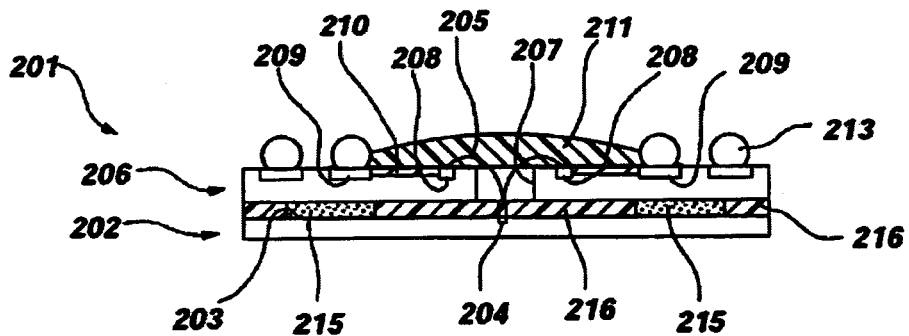

Fig. 1
(PRIOR ART)

UNITED STATES PATENT AND TRADEMARK OFFICE
CERTIFICATE OF CORRECTION

PATENT NO. : 7,041,532 B2  Page 3 of 7
APPLICATION NO. : 10/787872
DATED : May 9, 2006
INVENTOR(S) : Ford B. Grigg It is certified that error appears in the above-identified patent and that said Letters Patent is hereby corrected as shown below:

Replace FIG. 9 with the following:

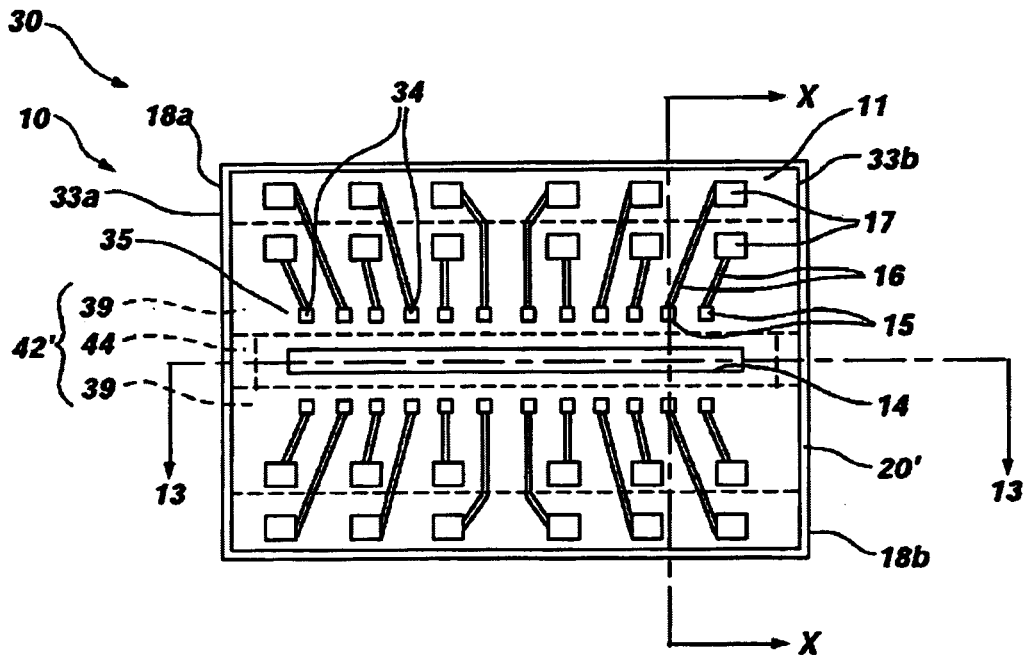

Fig. 9

UNITED STATES PATENT AND TRADEMARK OFFICE
CERTIFICATE OF CORRECTION

PATENT NO.        : 7,041,532 B2                                    Page 4 of 7
APPLICATION NO. : 10/787872
DATED             : May 9, 2006
INVENTOR(S)       : Ford B. Grigg It is certified that error appears in the above-identified patent and that said Letters Patent is hereby corrected as shown below:

Replace FIG. 11 with the following:

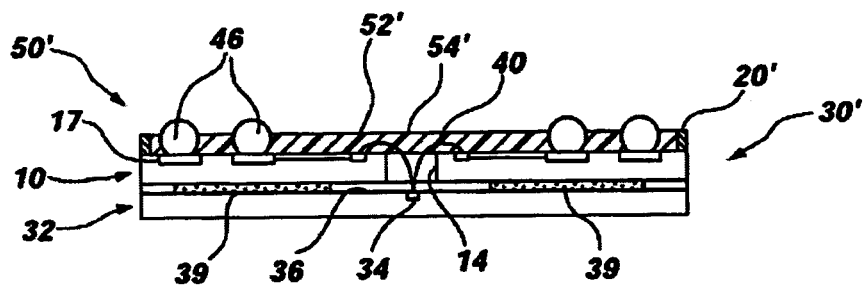

Fig. 11

UNITED STATES PATENT AND TRADEMARK OFFICE
CERTIFICATE OF CORRECTION

PATENT NO. : 7,041,532 B2
APPLICATION NO. : 10/787872
DATED : May 9, 2006
INVENTOR(S) : Ford B. Grigg It is certified that error appears in the above-identified patent and that said Letters Patent is hereby corrected as shown below:

Replace FIG. 12 with the following:

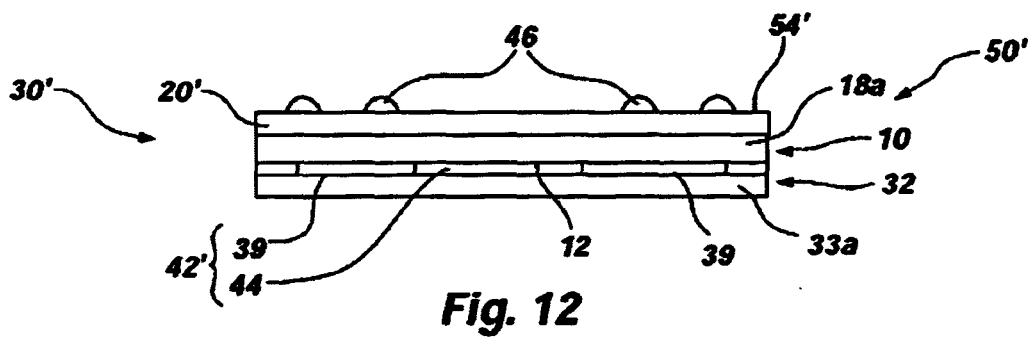

Fig. 12

UNITED STATES PATENT AND TRADEMARK OFFICE
CERTIFICATE OF CORRECTION

| | | |
|---|---|---|
| PATENT NO. | : 7,041,532 B2 | Page 6 of 7 |
| APPLICATION NO. | : 10/787872 | |
| DATED | : May 9, 2006 | |
| INVENTOR(S) | : Ford B. Grigg | |

It is certified that error appears in the above-identified patent and that said Letters Patent is hereby corrected as shown below:

Replace FIG. 13 with the following:

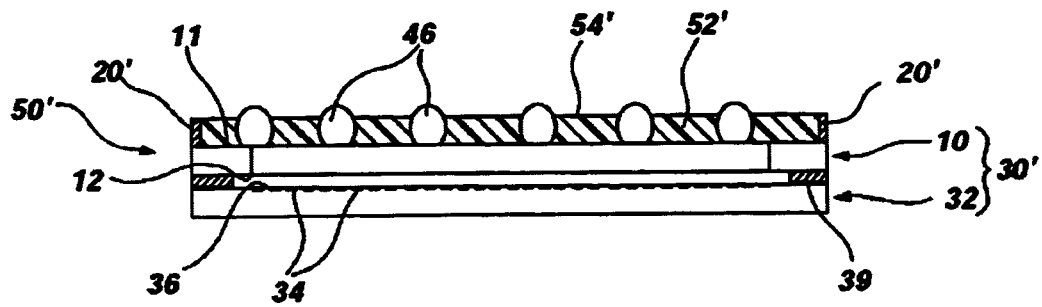

Fig. 13

UNITED STATES PATENT AND TRADEMARK OFFICE
CERTIFICATE OF CORRECTION

PATENT NO.         : 7,041,532 B2
APPLICATION NO. : 10/787872
DATED                 : May 9, 2006
INVENTOR(S)       : Ford B. Grigg It is certified that error appears in the above-identified patent and that said Letters Patent is hereby corrected as shown below:

Replace FIG. 14 with the following:

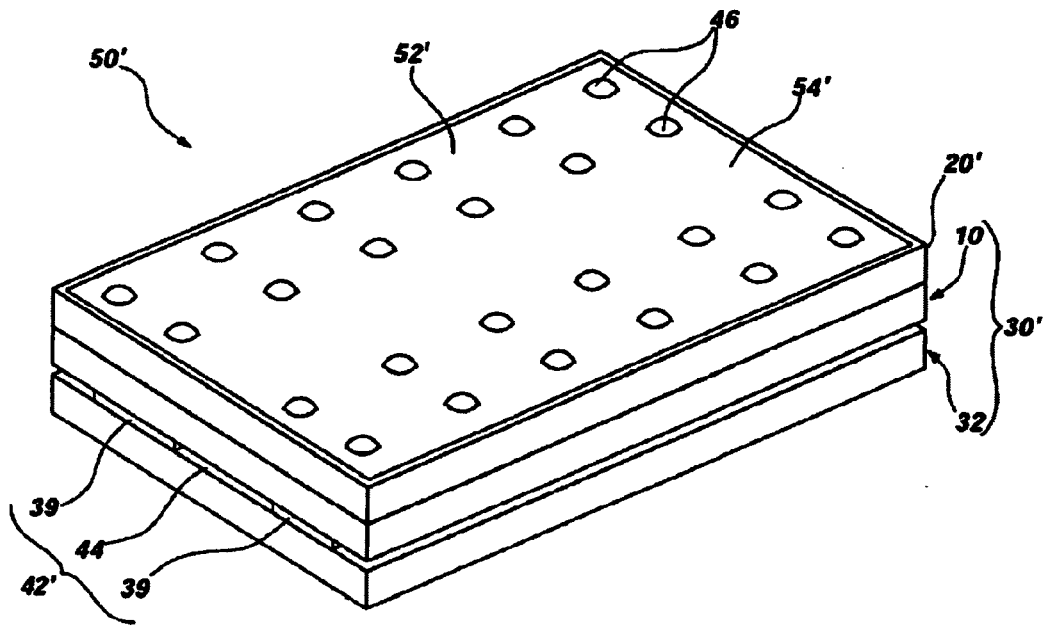

Fig. 14

Signed and Sealed this

Seventeenth Day of October, 2006

JON W. DUDAS
*Director of the United States Patent and Trademark Office*